United States Patent
Carpenter

(10) Patent No.: US 7,030,623 B1
(45) Date of Patent: Apr. 18, 2006

(54) ELECTRICAL SHORT TRACING APPARATUS AND METHOD

(76) Inventor: Kevin Carpenter, 5512 Millhouse Pl., Sacramento, CA (US) 95841

( * ) Notice: Subject to any disclaimer, the term of this patent is extended or adjusted under 35 U.S.C. 154(b) by 0 days.

(21) Appl. No.: 10/772,019

(22) Filed: Feb. 3, 2004

(51) Int. Cl.
G01R 31/02 (2006.01)
G01R 31/08 (2006.01)
G08B 21/00 (2006.01)

(52) U.S. Cl. .......................... 324/542; 324/522; 360/661
(58) Field of Classification Search ................ 324/522, 324/523, 524, 525, 526, 527, 539, 542; 340/660, 340/661

See application file for complete search history.

(56) References Cited

U.S. PATENT DOCUMENTS

| 3,569,826 A | | 3/1971 | Burnett | |
|---|---|---|---|---|
| 3,757,169 A | | 9/1973 | Beresnikow | |
| 3,991,413 A | * | 11/1976 | Berger | 340/537 |
| 4,237,721 A | * | 12/1980 | Dolan | 73/31.05 |
| 4,799,019 A | | 1/1989 | Cooley et al. | |
| 4,937,529 A | | 6/1990 | O'Toole, II | |
| 5,030,916 A | | 7/1991 | Bokitch | |
| 5,065,104 A | | 11/1991 | Kusko et al. | |
| 5,095,276 A | | 3/1992 | Nepil | |
| 5,144,226 A | * | 9/1992 | Rapp | 324/132 |
| 5,382,909 A | * | 1/1995 | Masia et al. | 324/522 |
| 5,514,964 A | * | 5/1996 | Benesh et al. | 324/509 |
| 5,721,688 A | | 2/1998 | Bramwell | |
| 5,903,160 A | | 5/1999 | Ianenko et al. | |
| 5,905,439 A | * | 5/1999 | McIntyre | 340/664 |
| 5,914,608 A | * | 6/1999 | Wissman et al. | 324/522 |
| 6,160,405 A | | 12/2000 | Needle et al. | |
| 6,323,654 B1 | * | 11/2001 | Needle et al. | 324/534 |
| 6,922,060 B1 | * | 7/2005 | Wendel et al. | 324/545 |

* cited by examiner

Primary Examiner—Anjan Deb
Assistant Examiner—Jeff Natalini
(74) Attorney, Agent, or Firm—John P. O'Banion

(57) ABSTRACT

A vehicle testing apparatus and method which facilitates tracing and isolating of short circuits. The tester preferably provides a user-selected constant current level (i.e. 1, 3 and 6 amperes) for driving a vehicle short under test at a constant current level compatible with the circuit. Any significant changes in the conductance of the vehicle short under test are registered in response to circuit voltage changes. An annunciator is activated in response to sudden significant conductance changes (preferably conductance decreases) which exceed a threshold level. Annunciation (preferably including audio output) allows the operator to immediately correlate movements of specific regions of wiring, or other circuit elements, with changes in the detected short conductance for the shorted circuit being tested. By way of example and not of limitation the tester may be implemented inexpensively with low cost analog circuitry, and does not require incorporating a microcontroller.

17 Claims, 2 Drawing Sheets

ELECTRICAL SHORT TRACING APPARATUS AND METHOD

CROSS-REFERENCE TO RELATED APPLICATIONS

Not Applicable

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

NOTICE OF MATERIAL SUBJECT TO COPYRIGHT PROTECTION

Figure 1A:
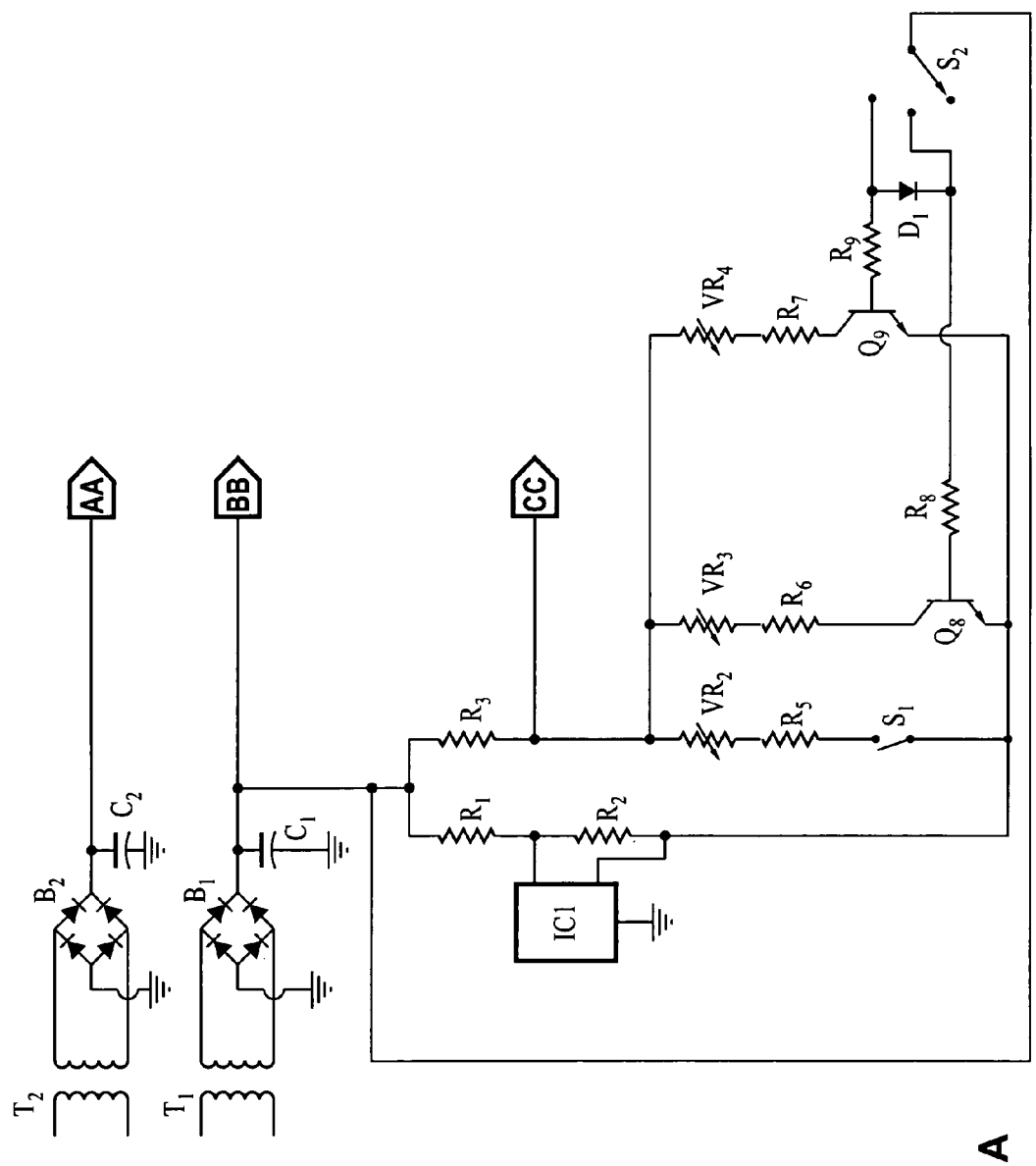

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND OF THE INVENTION

1. Field of the Invention

This invention pertains generally to short tracing devices for wiring, and more particularly to systems and methods for isolating vehicle short circuits.

2. Description of Related Art

A short in the electrical system of a vehicle is dangerous and can render the vehicle inoperable. An electrical short is created in a circuit whenever an unwanted current path develops from any portion of the circuit to other paths in the circuit or to elements which may be coupled to a potential in relation with the circuit, such as to a chassis ground.

It is often necessary to quickly locate short circuits in order to facilitate a rapid repair. For example, in the case of a short circuit in the electrical wiring of a vehicle, trailer, or tractor-trailer rig, the safety of the operator and other parties can be compromised as key vehicle systems may cease to operate properly and sparks or heat can be generated at the site of the short. Shorts which arise in wiring for vehicles, trucks, trailers, tractor-trailer rigs and so forth often result from shorts between one or more wires and the frame of the vehicle, and is often difficult to trace. It should be appreciated, however, that a short with continuous conductance is much easier to diagnose than a short which appears only intermittently, because unless the circuit is in a shorted condition one cannot perform electrical tests to locate the short. Complicating the tracing process is the fact that the vehicle circuit being tested typically comprises a single wire that is usually contained somewhere within a somewhat stiff bundle of similar wires which is often protected by a sleeve or overwrap of some form.

Electrical short tracing devices that are commercially available in the automotive repair industry typically utilize an intermittent pulsing mode, such as generated by a self-resetting circuit breaker. The tester with the self-resetting circuit breaker is placed into the shorted circuit through whatever connecting leads are being used, and power is applied to the shorted circuit through the resettable circuit breaker. The attachment of the short tracing device is typically established at a point in the circuit at which the original protection device for the circuit (i.e. fuse, fusible link, or a circuit breaker), has failed or become disabled as a result of excessive current flow due to the shorted condition. However, it is generally possible for the connection to be made anywhere along the length of the circuit, such as at the load or intermediary locations along the circuit.

A common method of testing for shorts is by sending the intermittent pulses down the shorted circuit while performing a tracing process, such as using handheld current sensors to detect the magnetic field which results from current flow along the circuit to the short. The pulse emitting device is electrically connected on a portion of the shorted circuit and power is applied. In response to an excessive current flow condition (exceeding the fixed circuit breaker limit) the circuit breaker device breaks the circuit, and then subsequently resets. The making and breaking of the circuit results in the generation of intermittent high current pulses that an operator can attempt to trace on the circuit toward finding the short.

In another form of automotive circuit testing device, a radio-frequency (RF) signal is coupled to the circuit under test and radiated along the wire to which it attaches. However, this form of RF testing does not work well for wires within wire bundles as found within automotive circuits, as the signal is shielded by the surrounding wires.

A number of drawbacks exist with the current short tracing devices and methods which have not been fully appreciated in the art, some of which are now described.

It should be noted that in the brief moment after power is applied very large electrical currents may flow through the circuit, prior to the resettable circuit breaker of the prior art tester being triggered into an open state. Test devices utilizing resettable breakers often utilize a ten ampere resetting breaker to provide sufficient signal strength for magnetic circuit tracing. With a ten amp trip point it will be appreciated that the actual current through the circuit could reach a peak that is about an order of magnitude above the threshold. For instance with a ten amp resetting breaker the peak current can easily reach one hundred amps for a short duration prior to tripping of the circuit breaker into an open state. It will be noted that the current peaks through the breaker typically vary with cycling and temperature. The current peaks through a resettable breaker, which initially exceed one hundred amperes (i.e. when cold), can upon being heated by repeated actuations drop significantly, such as to fifty amperes.

It should be appreciated that circuit breakers always exhibit a lag time between the conditions meeting the trip threshold and the circuit breaker entering an open-circuit state. Typically most high current circuit breakers are of a mechanical construction having elements which must heat up and overcome mechanical inertia between the time the current threshold is exceeded and the breaker trips into an open state. Electronic breakers also typically have a significant time lag, however, it is one that is intentionally built-in to the devices for limiting false triggering in response to noise pulses.

The current through the circuit-breaker during testing is generally concentrated through the path created by the shorted condition, yet some portions of the current may flow through other current paths within the circuit, such as to a load. Passing high current pulses through the shorted circuit can lead to a number of problems, such as damage to sensitive wiring or circuitry, and the inadvertent conversion of a static short to an intermittent short, which further complicates locating and repairing of a wiring short.

As a consequence of the large current flow passing through the shorted path, a significant magnetic field is generated around the associated conductor(s). The magnetic field obviously only arises along the portion of the conductor through which the current is flowing, which is typically between the point at which power is applied through the short tracing device (i.e. at a fuse box, at a load, at a connector, or other point in the circuit) and the point at which the circuit is shorted. It should be appreciated, however, that some portion of the total current may still flow to a load, or loads, that has not been disconnected. In many cases the current flow to the short, which generates the associated magnetic field, is traced using a handheld current detector, for example a magnetic needle-pointer type current detector (i.e. often a compass or compass-like device), Hall-effect detector (magnetic field strength sensing), or similar.

In using the self-resetting circuit breaker approach, the test device intermittently reapplies power to the circuit, resulting in repetitive current pulses being generated through the circuit. The duty cycle of this pulsed output signal is typically very low, in particular for circuits having a high conductance short, because the time over which current is passed through the shorted circuit is much less than the time required for the circuit breaker to break the circuit and then reset back to a closed circuit condition. With the typically slow-reacting resettable breakers, the fact that the trace signal is only available intermittently complicates locating the short. Even if faster-reacting resettable breakers are utilized, the average flux density of the magnetic field about the circuit path is still significantly impacted due to the low duty cycle output making circuit tracing more difficult or even infeasible in some instances.

In utilizing intermittent test pulses as described, the amplitude of the current pulses through the circuit-breaker often can exceed the maximum allowable current for the circuit, such as determined by the conventional fuse, or circuit breaker element, found in the vehicle. This is especially true for modern vehicles which often utilize a number of sensors or other low power electronic devices.

The effect of a huge current pulse, such as generated by the circuit breaker approach, can make the short circuit untraceable. In one situation sufficient heat can be generated at the short to separate the conductors to temporarily eliminate the short circuit condition. Although temporarily eliminating the short may at first glance sound like a benefit, it can be more accurately considered as masking a potential short circuit, or creating an intermittent short circuit condition. It is generally well appreciated that intermittent problems are far more difficult to diagnose than those which are constant and which more readily avail themselves of fault isolation.

High current pulses also result in high heat build-up on the wiring of the shorted circuit which often exacerbates the condition of the wiring near the short and perhaps elsewhere along the path of the short, increasing the severity of future shorts. The heat created by the large pulses of "testing current" may far exceed the maximum allowable current levels for that circuit, typically an indicator for which is the recommended amperage value for the fuse. The current passing through the short can cause other fuses or circuit breakers in the system to open up, and can damage other wiring besides the section damaged from the original short circuit.

An additional effect that is created by large current pulses which can produce temporary elimination of a short, converting it to an intermittent short, is a physical repulsion response of conductors subject to large current pulses. This mechanical repulsion reaction results from the substantial magnetic field created by the large current pulses and can be observed to cause wires to jump or move in response to the current pulse. In response to this force, the conductor(s) of the shorted circuit may pull apart enough to temporarily eliminate the short, typically resulting in an intermittent short or a short which will manifest itself at a later time, for example at night when the driver may be an inconvenient distance from repair facilities or populated areas.

Another drawback to the use of current pulsing, such as utilizing the circuit breaker approach, is that the signal duty cycle is dramatically reduced. In many cases the time for a resettable breaker to open and then reset back to a closed condition can exceed ten seconds, although it varies depending on construction and manufacturer. With the active time for the current pulse being less a few hundred milliseconds, the duty cycle of the testing pulses can be very low. Consequently, personnel attempting to test the circuit are provided with only short intermittent pulses with which to test the circuit, making isolation that much more difficult and time consuming.

Additionally, the intermittent pulses produce an uncertainty condition as a detector is moved from one point along the circuitry to the next because the person performing the testing may not be able to discern the pulse occurrence when it does not produce a response on the detector. When a pulse is not detected at any given point after a seemingly sufficient delay, it becomes necessary for test personnel to backtrack to a point at which the signal can again be detected, which considerably impacts the fault tracing process.

Another drawback which results from using an intermittently traceable signal, is that no indication can be provided as to when a short condition disappears, such as in response to a service technician handling the wiring along the circuit where a short has arisen. This is a critical drawback, because it is often necessary to physically handle circuitry in the process of tracing an electrical short. When the shorted condition results from contact between two conductors (i.e. between adjacent wiring, or between one or more wires and adjacent structures) which are not firmly held in contact with one another, physical handling of the circuit under test can result in the loss of contact at the point at which the circuit is shorted. In the absence of a continuous indication of the short, it can become impossible to locate where the short was occurring, and to determine what action resulted in the elimination of the shorted condition. The inability to correlate action, such as movement of specific wiring, with a responsive change in the short condition makes short locating far less definitive, and more prone to guesswork. Consequently, as a result of intermittent responses it is unlikely that whatever action produced the response can be directly associated with a narrowly restricted area of the vehicle circuitry.

Accordingly there is a need for a short circuit testing and isolation device that is particularly well-suited for troubleshooting electrical circuit wiring in a variety of vehicles and other systems employing similar current-carrying circuitry.

The present invention satisfies those needs and others, and may be implemented at low cost.

BRIEF SUMMARY OF THE INVENTION

An apparatus and method for testing shorted circuits in order to trace and isolate where the short is located along a circuit path. The present invention is particularly well-suited for use in tracing shorts within vehicle electrical systems (i.e. cars, boats, trailers, SUVs, trucks, tractor-trailers, airplanes, and so forth) in which circuits comprise wires contained within wire bundles.

The short circuit testing apparatus of the invention, hereafter referred to as the "vehicle short circuit tester", "circuit tester", or simply "tester", preferably comprises both a means for generating a test signal on a shorted circuit to facilitate tracing the short, and a means for generating an audible output in response to significant changes in the characteristics of the short circuit. The tester provides a selectable constant current within the bounds of the circuit under test, which facilitates tracing the current path to locate the short. It does not, however, generate intermittent high current pulses which pose difficulty in both the tracing and isolating of short circuits. The audible output of the tester is generated in response to significant changes in the current characteristics of the short without requiring that overall circuit current (i.e. to short and other loads) drop to a zero, or near zero, current level.

The system may be considered to comprise means for producing a controlled flow of current through the circuit being tested (i.e. vehicle circuit wiring) under test, and means of detecting and annunciating a sufficient change in the conductance of the circuit being tested (i.e. vehicle circuit wiring) through which said controlled flow of current is being passed. The current is preferably produced with a constant current source, wherein the conductance change is registered in response to detecting a voltage change. However, a voltage source may be alternatively, although generally less preferably, utilized insofar as the change in conductance is registered in response to detecting a change in current flow through the circuit (i.e. vehicle circuit wiring). Preferably the annunciations are produced in response to a significant reduction in conductance, such as the full or partial opening of a short in the circuit, which preferably comprises vehicle wiring being manipulated (wiggled) through which current is being passed.

One embodiment of a tester for electrical shorts according to the present invention comprises (1) means to produce a continuous source of a fixed current flow to a shorted circuit; (2) means to continuously monitor voltage across the circuit; and (3) means for audibly indicating a sudden change in circuit voltage. The fixed current for tracing the circuit can be set to an output level that is within the maximum current limit for the circuit (i.e. as established by the ampere value of the fuse or circuit breaker rating). A continuous source of fixed current is output from a reference circuit coupled to a control circuit having a feedback loop for maintaining a selected output current over a range of conductance for the circuit under test.

In another embodiment, an apparatus for isolating vehicle circuit shorts is described according to the present invention comprising (1) a power supply configured to supply operating and drive current; (2) a voltage reference circuit; (3) a selector coupled to the voltage reference circuit for user selection of an output current, preferably at or exceeding approximately one ampere but within the maximum current range for the circuit under test; (4) a current driver coupled to the voltage reference circuit and the selector for outputting a constant current as determined by the setting of the selector; (5) output connections for the current driver configured for coupling to a circuit under test; (6) a sensing circuit coupled to the current driver for generating an output signal in response to detecting a sufficient change in the impedance of a circuit under test; and (7) an annunciator circuit or device coupled to the sensing circuit for generating an alert, preferably an audio alert, in response to the output signal. It should be appreciated that the annunciator circuit can comprise an audio alert in combination with other forms of alert, such as visual or tactile alerts.

In a further embodiment, a method of locating a short within a vehicle circuit according to the present invention comprises (1) selecting an output current, by the user, which does not exceed maximum current limits for the circuit to be tested; (2) generating a constant output current into the circuit under test; wherein an operator can utilize a handheld current sensing device to trace the flow of current from the current output to the short; (3) activating an annunciator in response to any significant changes to the resistance of the circuit being tested; wherein movement of the wiring of the circuit which causes a change in the conductance of the short is announced to the operator.

By way of example, the current source may have one, or more preferably, multiple fixed ranges (i.e. 1 A, 3 A, 6 A, etc.) to suit the maximum amperage of the shorted circuit wiring to which the tester is to be attached. The output ranges allow the user to select an output which provides sufficient current for tracing a shorted circuit, such as over about one ampere, while restricting the output current to be within the limits of the circuit under test. It will be appreciated that low current circuits within the automotive industry typically allow 1, 2, 5, 10, 15, or 20 amperes, with larger circuits for select loads. The tester is well suited for use with various current sensors when tracing the circuit. Examples of current tracers include handheld devices with clamp-on or proximity based current sensors based on magnetic needles, Hall-effect sensors, or other technologies.

The invention provides numerous beneficial aspects for tracings and isolating shorted circuits, a number of which are outlined below.

An aspect of the invention is to provide for generating a test signal which facilitates rapid tracing of short circuits.

Another aspect of the invention is to generate a test signal for shorted circuits that may be utilized in conjunction with handheld current sensing probes.

Another aspect of the invention is to generate a test signal whose output current can be readily selected to suit the current capacity of the circuit under test.

Another aspect of the invention is to generate discrete levels of test signal current.

Another aspect of the invention is to generate annunciations, preferably audible, in response to conductivity changes in the short circuit.

Another aspect of the invention is an ability to indicate conductivity changes in a short circuit without necessitating that the current flow drop to zero amperes.

Another aspect of the invention is to test for conductivity changes in a short circuit without the need for generating intermittent high current pulses on the shorted line.

A still further aspect of the invention is to provide a low cost short circuit testing device that does not necessitate utilizing a computer for either circuit control or signal processing.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

Figure 1B:
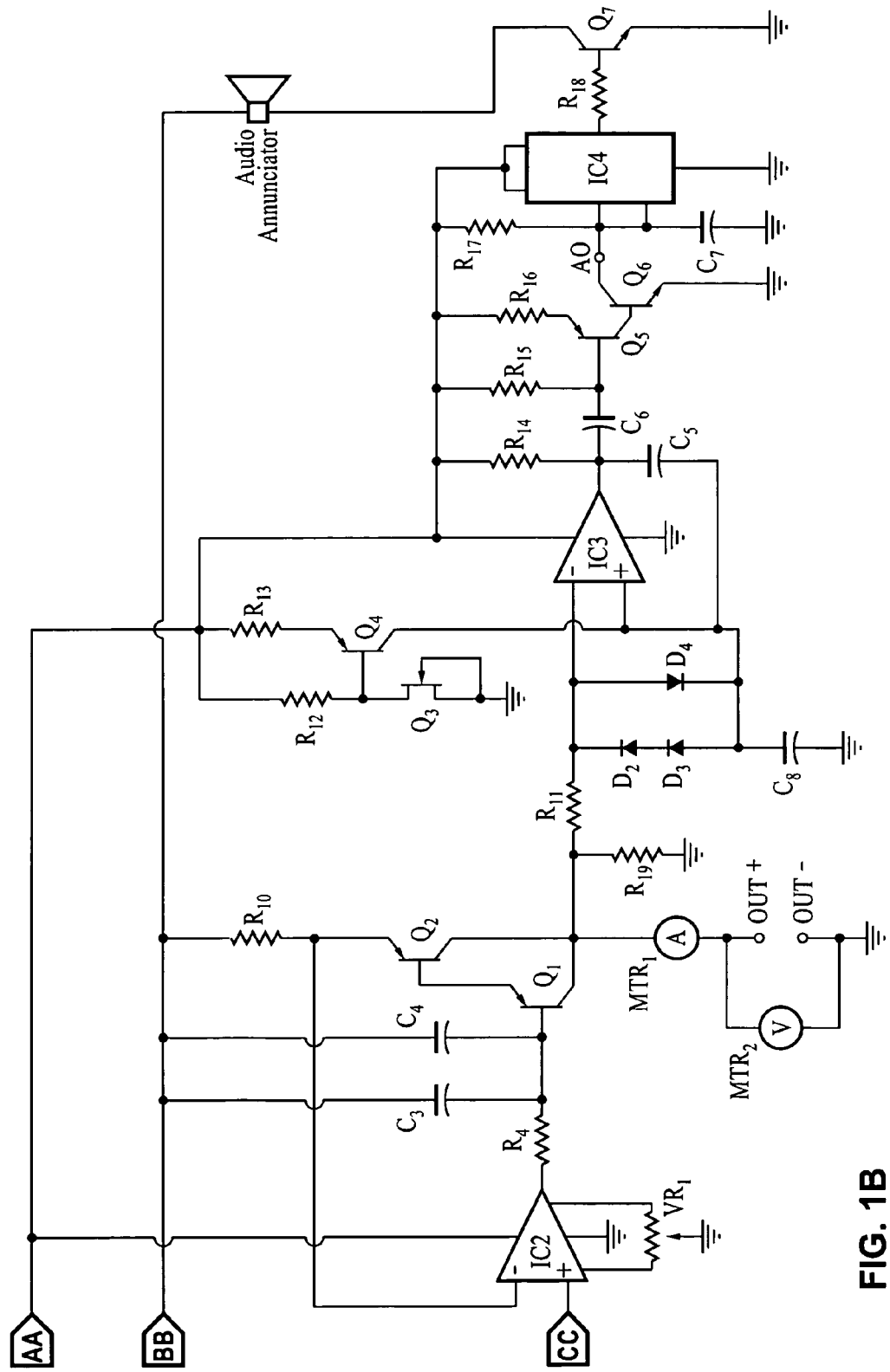

The invention will be more fully understood by reference to the following drawings which are for illustrative purposes only:

FIG. 1A and FIG. 1B are schematics of a circuit tester according to an embodiment of the present invention, showing analog circuitry for generating test signals and annunciations in response to short circuit tracing and isolation efforts.

DETAILED DESCRIPTION OF THE INVENTION

Referring more specifically to the drawings, for illustrative purposes the present invention is embodied in the apparatus generally shown in FIG. 1A and FIG. 1B. It will be appreciated that the apparatus may vary as to configuration and as to details of the parts, and that the method may vary as to the specific steps and sequence, without departing from the basic concepts as disclosed herein.

The short tracing device of the invention generally performs three major functions, (1) the sourcing of a predetermined "stiff" and consistently traceable current output (i.e. selectable within the range of 1–10 Amperes for 12V automotive circuits); the detection of a substantial change in short circuit conductance registered as a sufficient voltage change arising at the applied current level. (i.e. predetermined voltage increase within the range of from 0.2 volts to 1.0 volts); and the audible annunciation of the substantial conductance change.

The short testing device has an output section which sources a current to the vehicle circuit being tested. The magnitude of this current is maintained accurately within a given range of circuit conductance. Hence, there is a constant magnetic field produced about the path of sourced current flow, insofar as the conductance of the circuit remains the same. The magnetic field generated in response to the output current is of sufficient strength to be readily traced using any convenient current sensing probe, such as a handheld current sensing device that may utilize a clamp-on or proximal sensor. (i.e. compass needle style, Hall-effect sensor, or other sensor type).

The tester circuit allows tracing of the shorted condition by following the path of the sourced current flow and its accompanying magnetic field. In addition, the voltage that is developed across the circuit under test by the current source of the invention allows operators to accurately monitor changes in the conductance of the circuit under test wherein wire movements, or other changes of that circuit, can be readily correlated to changes in the status of the circuit short. In this way a short can be readily located and is not converted to an intermittent short situation prior to its being found.

For the purpose of allowing precise circuit monitoring, the output section is configured to source a level of current that remains constant within a limited tolerance as circuit conductance varies inside of a given range, for example the relative conductance of the circuit based on its present shorted condition. The current range being preferably sufficient (in accordance with specific component selection), to generate a sufficient change in monitored voltage when a reduction in conductance arises with the disturbance or elimination of a shorted condition. It will be appreciated that a negative feedback amplifier circuit, having a high voltage gain, can be utilized in conjunction with a high current gain circuit to precisely maintain a voltage drop across a precision power resistor of low resistance value, wherein a stiff but precise current output is produced. The circuitry is preferably configured to damp undesired alternating current (AC) current components that may arise when driving highly inductive loads, thereby reducing false triggering of the tester output.

The present embodiment of the vehicle short circuit tracing device preferably has multiple selectable output currents, such as the selections of 1, 3 and 6 amperes. It is preferred that output current be selectable within a range of between one to ten amperes, and more preferably one to six amperes. The present invention may also support a lower current selection for select testing scenarios, such as supplying about one half ampere of current output to sensitive circuits. In each of these ranges, the circuit is configured to produce a stable output current that remains constant within at least 0.1 amperes within the voltage range of the constant current source, and more preferably within 0.02 amperes even as the conductance of the circuit under test is varied. In response to changes in conductance of the circuit through which the constant current is applied, sufficient levels of voltage change can be produced for a detector to trigger an annunciation of the conductance change.

The tester preferably provides a highly stable output current (i.e. $\leq 0.05$ amperes) in response to changes in conductance of the vehicle circuit lead being tested. It is less important that absolute current output values be accurately maintained in response to temperature changes, between one use and another, or over periods of use spanning several minutes, because these changes will not lead to the generation of false alarms. Thereby the circuit provides high levels of short-term stability for accurately responding to changes in conductance, and requires less long-term stability with regard to changes in its own output current.

The output current of the tester remains constant in response to a short circuit of negligible resistance up to a resistance level at which the voltage drop approaches the available voltage for driving the current source of the device. It is preferable that the current control element (i.e. transistor) exhibit a low voltage drop (as a percentage of the supply voltage) at the rated maximum output current, so that a wider range of conductance is supported when testing the vehicle circuit. Various current control elements, such as bipolar transistors or field effect transistors, can be selected which provide a sufficient current capacity for use within the present invention.

For twelve volt automotive circuits an input voltage range for the present device embodiment within approximately the three to six volt range was found to be sufficient for tracing common short circuits. The range of voltage within which a fixed current output can be maintained is greater in lower current ranges as the voltage drops in the internal circuits of the tester are reduced subject to reduced current flow. It should be appreciated that the present vehicle testing system can be adapted with a variety of input voltage ranges and output currents which would be suitable for testing a variety of vehicle circuits. For example vehicles with higher voltage systems can be tested, such as 28 volt aircraft systems and newer 42 volt automotive systems.

The detection/annunciation section of the tester apparatus provides monitoring of the conductance of the circuit under test by way of the voltage response of the circuit for the given current, wherein the operator of the short circuit tracing device is notified in response to altering or eliminating the source of a shorted condition. This detection serves at least two distinct purposes. First it allows making the equipment operator aware when the shorted condition is disturbed in the process of fault tracing, which can result from the unavoidable moving of conductors and components as necessary during the tracing process. Secondly, it allows the equipment operator to check for the location of the short by "wiggling" wiring or other circuit elements when attempting to pinpoint the location of the short within the circuit under test.

The detector section of the short tracing device produces a response to changes in circuit conductance, which for example is based on the changes in the voltage that is developed across the circuit under test by the current that is sourced to that circuit by the output section. As the conductance of the circuit under test decreases in response to the elimination or conductive changes in a shorted circuit, the voltage produced by the sourced current through the circuit will rise. In the case of a circuit that transitions from a shorted state to an open state, the voltage could potentially rise from some relatively low level to maximum voltage that the output section can produce.

However, it should be appreciated that in many situations, the circuit under test may still have some level of conductance after elimination of the shorted condition, such as in response to system loads which remain on the circuit. In these situations, the voltage output of the circuit under test will rise to some level less than the maximum value available from the output section. Therefore, the detector section is designed to allow detection to occur with a limited rise in voltage, which is determined in accordance with the specific components selected within the detector section.

It is characteristic of some circuits, specifically those whose normal electrical load consists partly or wholly of incandescent lamps, to have a transitory conductance from the time that current is initially sourced to such loads. So if the load comprises a light bulb load, or similar, once the short is removed (short conductance drops to zero) the current through the cold filament of the bulb will attain its maximum value (for the given level of applied current) and then as the element heats up the conductance of the filament will taper off toward an equilibrium conductance, typically after a few seconds. Therefore, the detector section of the present invention preferably provides a response to a voltage rise that occurs over a period in the range of one to several seconds, which is a typical time of conductance reduction in a circuit whose electrical load(s) consist of incandescent lamps. This delay occurs as a fixed level of current is sourced to the circuit and the temperature of the lamp element(s) increases, in turn resulting in a reduction in conductance and a rise in voltage, which further, in turn, increases the heat generated in the element(s), ultimately reaching a point at which the lamp element temperature and heat dissipation, along with the heat generation, reaches an equilibrium point. The response curve for the detector, measured in volts per second, is determined in accordance with the specific selection of components used to construct the detector circuit, and is preferably configured to prevent false triggering with the combination of loads within the application to which the tester is to be applied.

The annunciation portion of the detector section preferably utilizes a retriggerable timer circuit which provides a sufficient fixed length of annunciation to alert the operator and which can be extended when conductance changes are detected while the annunciator is active. For example an annunciator output period of from about one half second to one second was found to provide a sufficient length alert while not unduly masking fluctuations.

Because of the time delay in the detector circuit that provides for the conductance changes over a relatively long time period (i.e. in the one to several seconds range) for circuits comprised of incandescent lamps, as compared to the relatively instantaneous response of other circuits, the detector circuit is capacitively coupled to the annunciation circuit, thereby making the annunciation period virtually unaffected by the time delay feature. In addition, the output of the comparator that detects the voltage rise/conductance reduction is provided with capacitively coupled positive feedback to reduce false detections.

FIG. 1A, FIG. 1B is a schematic of an illustrative embodiment of the short circuit tester of the present invention, shown on two interconnected sheets. The functioning of an embodiment of the short tracing device circuits as depicted in the schematic diagram are described herein with component selection and values provided by way of example. Component values are generally provided in the description which are associated with the embodiment as shown in the figure. It should be appreciated that the component values, component selection, and circuit configuration are all described by way of example. It should be appreciated that one of ordinary skill in the art may implement the functions of the present invention in a number of alternative ways without departing from the teachings of the present invention.

The embodiment shown in the schematic provides for selection of discrete current level outputs (1 A, 3 A, 6 A), and an audio form of annunciator in response to sensing a significant change in circuit voltage response.

An optional split power supply arrangement is shown utilizing transformer $T_1$ with a rectifying means, such as bridge $B_1$ (i.e. full-wave diode bridge), and transformer $T_2$ with rectifying means, such as bridge $B_2$, with power received from an alternating current (AC) source. It will be appreciated that the unit can be alternately configured for being powered from DC power sources, such as a vehicle battery. The use of dual transformers allows voltage outputs to be more readily matched to the circuit elements to provide high noise margins while generating lower levels of heat dissipation. It should be recognized that a number of alternative power arrangements may be implemented without departing from the teachings of the present invention.

Transformer $T_1$ provides the current for the output section and for the annunciator. The reference voltage to the feedback amplifier IC2 (i.e. LM741 series op-amp) is referenced to the rectified voltage output of $T_1$ and rides along with any fluctuations therein. In the embodiment shown transformer $T_1$ preferably is specified to produce 6.3 volts AC-RMS from the secondary winding with a 117 VAC-RMS primary input under loaded output conditions. Transformer $T_1$ is selected to provide sufficient output current, such as between six to ten amperes, to support the circuits and the selected level of current to the circuit under test. Transformer $T_1$ preferably provides a sufficient combination of voltage/current output for the tester without requiring the power transistor of the output stage to dissipate large amounts of heat, even when the output is shorted to approximately zero volts.

Transformer $T_2$ preferably provides a slightly greater voltage than that of transformer $T_1$, to allow reliable operation of the integrated circuits and the current source of the detector section, wherein the positive supply voltage of these devices is always several volts greater than that of the rectified output from transformer $T_1$ For example, in the embodiment shown transformer $T_2$ is preferably selected to have a secondary voltage of about 12 VAC-RMS with a primary voltage of 117 VAC-RMS, which in this case produces a rectified DC output of 17 volts.

The rectified power supply outputs are filtered by capacitors $C_1$ and $C_2$. Capacitor C, for example is a 0.3 F device which filters the rectified output of $T_1$ resulting in a 0.2 volts peak-to-peak ripple at 6.0 amps output. Capacitor $C_2$ for example is a 3600 µF unit that filters the rectified output of $T_2$ and produces an output with less than 50 mV peak-to-peak ripple with the device operating in any output range. Smaller high frequency capacitors of 0.1 µF or less are also preferably coupled between the supply output and ground to reduce higher frequency noise components (not shown). Inductive RF chokes may also be incorporated in the supply line as desired, preferably on the supply side of the filter capacitors, to further aid in reducing power supply ripple.

Integrated circuit $IC_1$ is a voltage regulator, providing an externally set output voltage selection. The regulator shown maintains a voltage of 1.3 volts across resistor $R_2$, which in turn results in maintaining a voltage of 1.3 volts across resistor $R_1$. Therefore, a constant voltage across series combination of resistors $R_1$ and $R_2$ is maintained at 2.6 volts as referenced to the direct current (DC) output of capacitor $C_1$. Resistors $R_1$ and $R_2$ preferably are selected with sufficiently low resistance values (i.e. 33 Ω) so that changes in the resistance of the voltage divider circuit do not appreciably affect voltage regulation.

The voltage divider that consists of resistor $R_3$ in series with parallel combinations of $VR_2+R_5$, $VR_3+R_6$, or $VR_4+R_7$, is connected to produce a voltage drop across resistor $R_3$ that creates the reference voltage applied to the non-inverting input of $IC_2$. When variable resistance $VR_2$ plus resistor $R_5$ is the only branch in series with resistor $R_3$, the approximate 28 KΩ resistance of variable resistance $VR_2$ plus resistor $R_5$ in series with the 220 Ω of resistor $R_3$ divides the 2.6 volts of resistors $R_1$–$R_2$ to produce a drop of 0.020 volts across resistor $R_3$. The voltage output of $T_1/C_1$ minus this 0.020-volt drop is then applied to the non-inverting input of $IC_1$.

Component $VR_2$ is a variable resistor that allows the resistance of the branch consisting of $VR_2+R_5$ to be precisely adjusted to produce the desired output current in the 1.0 amp range. Switch $S_1$ can be opened to allow a zero current adjustment utilizing variable resistance $VR_1$, which controls the zero offset compensation input to $IC_1$.

The other two conductive circuit branches add to the total conductance of the parallel branches so as to increase current flow and the voltage drop across resistor $R_3$ increased to 0.06 volts for an output of 3.0 amps, and 0.12 volts for an output of 6.0 amps. Each conductive branch can be adjusted in the same fashion as variable resistance $VR_2$ plus resistor $R_5$.

Transistors $Q_8$ and $Q_9$ allow the additional branches to be electronically switched into the circuit. They are energized when switch $S_2$ applies the same positive voltage level to them as is applied to the voltage divider circuit, which is the rectified output voltage of transformer $T_1$.

Switch $S_2$ applies voltage to the base of each of the transistors, such as via a 1 KΩ resistor. The transistors are activated in an additive fashion so that one range is not switched out as the next, higher range selection is switched into the circuit. Likewise, changing to a lower range simply subtracts current from one range to the next.

Obviously, the first increase in output range is added by applying voltage to the base of transistor $Q_8$ via resistor $R_8$. In this case, the branch containing variable resistance $VR_2$ and resistor $R_5$ is already in coupled to the circuit and remains throughout device operation, with switch $S_1$ being provided only for the purpose of setting zero offset. Therefore, the addition of the branch containing variable resistance $VR_3$ and resistor $R_6$ does not have the potential of dropping output current prior to switching in the higher range.

Switching in the branch containing variable resistance $VR_4$ and resistor $R_7$ requires that a voltage remain applied to resistor $R_8$ to also allow adding this branch to the circuit. Therefore, the voltage output from switch $S_2$ is applied to resistor $R_9$ powering the base of transistor $Q_9$, while it is also applied to resistor $R_8$ through diode $D_1$. Although diode $D_1$ produces a loss of voltage being applied to resistor $R_8$, there remains greater than 1 volt across resistor $R_8$, and as the resistance of resistor $R_6$ plus variable resistance $VR_3$ is greater than about 10 KΩ, there still remains sufficient base current in transistor $Q_8$ to reach hard saturation, as well as for saturating transistor $Q_9$. As a result the collector-emitter voltages of transistors $Q_8$ and $Q_9$ have insignificant impact on the circuit.

Additionally, switch $S_2$ maintains contact between the existing pole selection of the switch and a subsequent pole selection until the subsequent pole fully establishes contact, providing a seamless transition from one selection to the next, in what is commonly referred to as "make-before-break" contacts within a multi-pole switch.

Integrated circuit $IC_2$ is an operational amplifier, such as an LM741, which produces a DC voltage gain of approximately 100,000. Its inverting input is connected to the low side of emitter resistor $R_{10}$ of output transistor $Q_2$. Therefore, the op-amp acts to maintain, within a very close tolerance, its output voltage at whatever level is needed to produce a constant voltage drop across the emitter resistor that is equal to the drop across resistor $R_3$. The op-amp compensates, within a given range, to adjust for variations in current gain in the combined function of transistor $Q_1$ and transistor $Q_2$, and for any fluctuations in source voltage from $T_1/C_1$, and for any variations in voltage of the circuit under test (output voltage).

Resistor $R_4$ limits the sink current of op-amp $IC_2$, such as a 1 KΩ resistor utilized in the circuit shown. With a tester output of 6.0 amperes the voltage drop across resistor $R_4$ was measured at less than 1.1 volts, with the voltage output of the LM741 remaining at greater than 4.0 volts thereby having substantial room to sink additional current as necessary.

Capacitors $C_3$ and $C_4$ damp any variations in the voltage at the base of transistor $Q_1$ such as a 470 µF electrolytic capacitor in the $C_3$ position and a 10 µF tantalum capacitor in the $C_4$ position. The electrolytic capacitor provides a large value of capacitance, while the tantalum capacitor provides a faster response to high frequencies.

Capacitors $C_3$ and $C_4$ aid in reducing false detections, which otherwise arose when driving inductive loads, such as starter solenoids. Apparently, small amounts of ripple in the output current caused a reactive response from the solenoid windings, and the inductor then produced voltage spikes, which triggered the detector circuit. The addition of capacitors to the base of transistor $Q_1$ was found to eliminate the false detections. In addition, the capacitance of capacitor $C_3$ and $C_4$, in series with resistor $R_4$, produces a desirable damped response upon changing current ranges.

A high power transistor was selected for transistor $Q_2$ in order to handle the heavy output current loads. Transistor $Q_2$ as embodied herein comprises an NTE 30 device which is capable of handling about 50 amperes and/or 300 watts, far exceeding present circuit requirements. Transistor $Q_1$ as embodied herein comprises a TIP 30 transistor, whose base is driven by the output of $IC_2$, and which in turn drives the base of transistor $Q_2$ which controls the output current. Under typical conditions the two transistors described produce a combined current gain of approximately 6000 in the 6.0 ampere output range and 7000 in the other two ranges.

In a less preferred approach (not shown) the current output stages can be adapted to automatically perform periodic switching between fixed constant current levels, such as being preferably synchronized with the detector circuit. The voltage detector thereby preferably changes its detection thresholds automatically when the current output is changed, and preferably ignores events, such as voltage changes, which arise near the time of a current output change.

Resistor $R_{10}$ is the output circuit emitter resistor, having a value of $0.020 \, \Omega$ for the embodiment shown. This small resistance value produces a very low voltage drop across the resistor at the 6.0 ampere output level, specifically approximately 0.12 volts. By configuring it with a very small output voltage drop the majority of the available source voltage remains to be applied to the circuit under test as necessary for the given current output selected, while also limiting heat generation.

Meters, or other devices for indicating amperage and/or current, are shown optionally coupled to the circuit as ammeter $MTR_1$ for observing actual output current flow, and voltmeter $MTR_2$ for observing the voltage produced across the circuit under test for the given current output. Although shown integrated within the embodiment, one or both of these meters can be eliminated (replacing MTR1 with a conductive jumper to sustain the current path), or means provided (i.e. connectors) for coupling these meters into the circuit when desired.

Resistor $R_{11}$, such as $390 \, \Omega$, provides a small buffer resistance between the circuit under test and the detector circuit, but otherwise does not significantly alter device operation. Resistor $R_{19}$ provides an alternate path for the 22 μA current output of transistor $Q_4$ when the detector is not attached to a circuit under test.

Transistor $Q_3$ preferably comprises a junction FET, and is configured to operate in its active region, with its gate to source shorted to provide a controlled current sink. This particular JFET, an NTE 457, sinks about 3.8 mA with only minor variation.

The 3.8 mA which is sunk by transistor $Q_3$ produces approximately a 4.6-volt drop across resistor $R_{12}$ biasing the base of transistor $Q_4$ for maintaining approximately 4.0 volts across resistor $R_{13}$, thereby producing a current flow of approximately 22 μA through resistor $R_{13}$. Virtually all of the 22 μA passes through the collector of transistor $Q_4$ and is applied to capacitor $C_8$ and the non-inverting input of $IC_3$.

The charge on capacitor $C_8$, such as a 22 μF, is sourced by the 22 μA output of transistor $Q_4$. When the charge on capacitor $C_8$ exceeds the forward voltage of diode $D_2$ together with diode $D_3$ (approximately 0.6 volts), the current sourced by transistor $Q_4$ is passed on to the circuit under test via resistor $R_{11}$. This results in the stored charge on capacitor $C_8$ being approximately 0.6 volts greater than the voltage of the circuit under test, while the voltage of the circuit under test remains constant. Receiving the 22 μA of charging current from transistor $Q_4$, capacitor $C_8$ charges at a rate of approximately 1 volt per second.

The sensing circuit in the present invention generates an output signal in response to detecting a sudden change in voltage in the circuit under test which exceeds a predetermined voltage change value within a given length of time. The threshold is preferably set so that increases in circuit voltage which exceed a predetermined voltage in the range of 0.2 volts to 1.0 volts, or more preferably in the range of 0.4 volts to 0.7 volts, cross the threshold resulting in the generation of an annunciation to the user.

Any combination of PN junctions can be placed into the circuit at the point that diodes $D_2$ and $D_3$ are placed, allowing the quiescent voltage difference between the charge on capacitor $C_8$ and the circuit under test to be adjusted in accordance with varying applications. By utilizing two diodes, as shown, one of the two can be switched out of the circuit (not shown) thereby increasing device sensitivity.

The differential voltage may also be established by sourcing current through a resistor or resistor network. However, the use of a forward biased diode in this position allows capacitor $C_8$ to discharge back to the desired differential level whenever the conductance of the circuit under test increases, wherein its voltage drops. Thereby, the charge voltage on capacitor $C_8$ automatically readjusts in preparation for subsequent decreases in conductance following an increase therein. A resistor would not similarly support this feature, while utilizing active circuitry to provide the feature adds complexity. It should also be appreciated that other passive or active circuits may be utilized in place of the combination of diodes at the input of $IC_3$.

Integrated circuit $IC_3$, such as an LM311 high-speed comparator, compares the voltage of the circuit under test, as applied to the inverting input, to a voltage that is maintained above than that of the circuit under test, such as at about 0.6 volts, and is applied to the non-inverting input. Whenever the voltage at the inverting input exceeds that of the non-inverting input, the output of the LM311 goes into sinking mode and grounds the attached circuit, otherwise the output remains open circuited and free to be pulled up by resistor $R_{14}$.

Whenever the voltage of the circuit under test rises to greater than its former voltage plus 0.6 volts, the voltage at the inverting input of op-amp $IC_3$ exceeds that of the non-inverting input, resulting in its output grounding and pulling the voltage applied by resistor $R_{14}$ to approximately zero volts. This does, of course, require that the rate of increase in circuit under test voltage exceed 1 volt per second (the charge rate of capacitor $C_8$) plus 0.6 volts. In the case of detaching the shorted portion of a circuit under test, having no incandescent lamp loads attached to it, the rise in voltage can be expected to be approximately instantaneous. However, in the case of a circuit having incandescent lamp loads attached, the circuit should have the ability to respond to a gradual rise in voltage upon removal of the source of a shorted condition. It should be appreciated that the resistive impedance of a number of different forms of loads will vary in response to operation, such as due to thermal heating. The detection function, however, is configured to respond without undue false alarms.

Diode $D_4$ limits the amount by which the voltage of the circuit under test can exceed that of the charge on capacitor $C_8$ which is approximately 0.6 volts. This limiting of the current amount by which the circuit under test voltage exceeds that of the charge on $C_8$ shortens the time that might be required for the detector to respond to a subsequent reduction and rise in circuit under test voltage, one which follows a substantial increase in circuit under test voltage but itself represents a lesser change in voltage than the one that preceded it.

Capacitor $C_6$ capacitively couples the output of comparator $IC_3$ to the annunciator circuitry, depicted preferably as an audio annunciator. A negative current pulse arises from the output of capacitor $C_6$ when the output of $IC_3$ grounds resistor $R_{14}$, pulling the negative plate of capacitor $C_6$ to ground. This also momentarily pulls to ground the positive plate of capacitor $C_6$, which is then pulled back up by resistor $R_{15}$. Afterward, resistor $R_{15}$ allows the positive plate of capacitor $C_6$ to return to a discharged state when the negative plate returns to a high level.

The combination of capacitor $C_6$ and resistor $R_{15}$ have a time constant of 22 mS, making the time required for capacitor $C_6$ to charge back to approximately the voltage that is applied to resistor $R_{15}$ substantially less than the time of a single annunciation. This means that the annunciation time will not be substantially altered as the time required for the circuit under test voltage to rise to a sufficient detection level varies in accordance with circuit response.

Capacitor $C_5$ provides a positive feedback pulse to $IC_3$, which prevents false detections which have been found to sometimes occur as the charge on capacitor $C_8$ gradually rose to exceed the voltage of the circuit under test.

Transistor $Q_5$ is biased to an on state when the positive plate of capacitor $C_6$ is pulled to ground. Resistor $R_{16}$ controls the emitter current of transistor $Q_5$ to produce its base current and the base current of transistor $Q_6$, which strongly saturates transistor $Q_6$. The output of transistor $Q_6$ grounds the RC input to $IC_4$, thereby triggering the annunciator function. An auxiliary output AO (annunciator output) is also shown in the schematic, which can be utilized as a trigger for additional or alternative forms of annunciation.

The detector stage described above generates an annunciator trigger output in response to a sufficient voltage increase arising in the circuit under test (conductance of the short decreasing). Within the present embodiment of the invention the sufficient voltage increase is configured to be a predetermined (or optionally user selected) discrete voltage drop in the range of from about 0.2 V to 1.0 volts with a preferred range being from 0.4 V to 0.7 V. It should be appreciated that the voltage threshold within the present invention may be preferably set to any voltage within an infinitely variable number of voltage levels. For example utilizing a silicon diode with a drop of approximately 0.45 V at the given bias current, combined in series with a germanium diode having a drop of approximately 0.15 V results in a threshold of about 0.6 Volts. It will be appreciated that a number of discrete voltage thresholds can be readily implemented, or a selection device incorporated to allow user selection of sensitivity. One preferred combination was the use of a silicon diode with two germanium transistors to yield a threshold of about 0.6 Volts.

It should be appreciated that the voltage drop produced by a diode depends on the material and construction of the diode as well as the amount of current passing through the diode. By way of example, a lower voltage change threshold can be achieved utilizing lower threshold diodes, active circuits, resistors, and so forth; while a higher voltage change threshold can be easily achieved with LEDs, Zener diodes, resistors, active circuitry, the use of more diodes, and so forth.

For example in the present embodiment an annunciator trigger is generated in response to a voltage change spanning: 0.0→0.7 volts; 0.2→0.9 volts, 0.4→1.1 volts, 0.6→1.2 volts, 0.7→1.4 volts, 1.0→1.7 volts, 1.4→2.1 volts, 2.1→2.8 volts, 2.8→>3.5 volts, and so forth. Within this embodiment, any voltage increase of 0.7 volts arising within a short period of time triggers the annunciator. Likewise, the annunciator trigger is not generated for this example embodiment in response to increases which do not change sufficiently to exceed a selected level, such as to which the instrument is calibrated (calibrated voltage threshold level). For example the annunciator is not triggered in the present example for a change in voltage from 0.0 to 0.5 volts which is insufficient to trigger an audible alert, as would be changes from 0.7 to 1.2 volts, 1.4 to 1.9 volts, 2.1 to 2.6 volts.

The device thereby generates a given output current level and annunciates any voltage increases (or less preferably changes of either polarity) that exceed a predetermined voltage level. The device responds to a rise in the circuit under test voltage which crosses a predetermined threshold voltage selected from an infinitely variable number of levels. The range of possible circuit voltages is defined by the voltage to which the output section can drive the circuit under test once the shorted condition is relieved, minus the voltage difference. By way of example the output section of an existing prototype was able to source 6.0 amps to a voltage of at least 2.7 volts, wherein the quiescent voltage of the circuit under test can trigger an annunciation over a 2.1 volt range (2.7 volts minus the 0.6 volt rise required to produce a detection). Of course, this assumes that the 6.0 ampere current output is necessary for raising the circuit under test voltage to more than 0.6 volts greater than that of it having a shorted condition. In the situation in which the short being tested is completely opened, or nearly completely opened, an annunciator output can be generated in response to an infinite number of voltage level shifts which exceed the detection threshold, yet remain bounded by the maximum no load voltage of the output circuit.

Integrated circuit $IC_4$ is depicted as an LM555 timer circuit that is configured as a single shot, monostable multivibrator. When capacitor $C_7$ is discharged by transistor $Q_6$, the input voltage at pins 2 and 6 of $IC_4$ drops to approximately zero volts, triggering the timer to produce a high level output. In response to transistor $Q_6$ turning off, capacitor $C_7$ charges through resistor $R_{17}$. When the voltage on capacitor $C_7$ reaches about 67% of the voltage input to the timer IC, the output of the timer then switches state to a low level output, pulling the output toward ground. Since reaching a 67% charge on capacitor $C_7$ requires approximately a period equal to approximately 1.1 time constant, as determined by the resistance of resistor $R_{17}$ and the capacitance of capacitor $C_7$, and since capacitor $C_7$ has a capacitance of 1 µF and resistor $R_{17}$ has a resistance of about 680 KΩ, resulting in a time constant of about 0.68 seconds, wherein the timer remains at the high level output for approximately three quarters of a second. This subsecond annunciation period is sufficient to positively alert the equipment operator of a detection. The output is, however, also sufficiently short as to make way for subsequent detections. Repeated detections that arise in less than the time of a single annunciation will produce subsequent discharging of capacitor $C_7$ and, in turn, produce an extended annunciation, whose departure from the fixed length is noticeable to the operator. For example, wiggling a portion of a wire, wherein it toggles between short circuit and open circuit, can result in a continuous beeper output verifying the short location.

When the output of $IC_4$ goes high, voltage is applied to resistor $R_{18}$, which drives base current through transistor $Q_7$, activating it and providing a ground to the negative lead of the annunciator. The annunciator is shown comprising a 6-volt buzzer, although any convenient form of audio annunciator may be utilized. Although generally less preferable, visual and/or tactile outputs can be additionally or alternatively utilized herein. The positive input to the annunciator is provided by the output from transformer $T_1$, so as not to place an additional load on the filtered output of transformer $T_2$.

The circuit for detecting circuit voltage increases from any quiescent state, as described above, can be adapted in a number of alternative ways without departing from the present invention. In a less preferred alternative annunciations are generated in response to the circuit voltage at the constant source current exceeding a static voltage level. By way of example, the timer within the circuit of FIG. 1A, and FIG. 1B can be adapted, such as by altering the voltage ladder configuration, so that voltage changes in the circuit under test triggers the circuit. For example by utilizing a divider in the proportion of 3/1/1, which is coupled to a regulated 5.0 volt input, thereby establishing a 1.0 volt trigger level and a threshold level at 2.0 volts. In this implementation, the voltage of the circuit under test would have to drop to less than 1.0 volts to condition the circuit such that it could respond to a voltage rise. The voltage rise would then have to raise the circuit under test voltage to greater than 2.0 volts to produce an annunciator response. Although the fixed voltage thresholds could be adapted for any desired voltage trigger and threshold, the use of fixed voltage levels generally presumes that the conductivity of the short is sufficient so that the quiescent circuit voltage is less than some fixed value and subsequently changes to cross an annunciation threshold.

Accordingly the present invention provides a short circuit tester which is well suited for tracing and isolating shorts within vehicles or in similar applications, which require tracing of shorts on wires within wiring bundles which are connected to high current circuits (i.e. exceeding one ampere), such as systems driving motors, lights, and the like. Circuitry has been described in detail for providing both a proper signal output to facilitate tracing of the circuit with a current sensing probe and for indicating changes in the resistance at the short which indicates when movement of the associated circuit under test elements, typically wiring, has altered the impedance of the short. The circuitry may be implemented in a number of alternative ways without departing from the teachings presented herein.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. An apparatus for tracing electrical shorts in a wiring circuit under test, comprising:
   means for producing a continuous source of substantially fixed current flow into a wiring circuit under test, said means for producing current configured for establishing an electrical connection to the wiring circuit anywhere along the length of the wiring circuit;
   means for continuously monitoring voltage across said circuit under test, said means comprising,
      a comparator circuit adapted to detect a plurality of sudden changes in applied voltage in response to said substantially fixed current flow,
      a charge storage capacitor coupled to a first input of said comparator circuit configuring said comparator circuit to detect a first direction of voltage change in the wiring circuit in relation to a former voltage level; and
   means for audibly indicating a sudden change in circuit conductance, in relation to a preceding value of conductance and not a fixed value of conductance;
   wherein said sudden changes in voltage are detected in response to voltage changes in the wiring circuit which exceed a predetermined voltage change within a given length of time and are communicated to said means for audibly indicating a sudden change.

2. An apparatus as recited in claim 1, wherein said means for producing a continuous source of fixed current comprises a reference circuit coupled to a control circuit having a feedback loop for maintaining a selected output current over a range of conductance for said circuit under test.

3. An apparatus as recited in claim 1, wherein said means for producing a continuous source of fixed current is configured for generating a fixed output current exceeding approximately one ampere.

4. An apparatus as recited in claim 1, wherein said means for producing a continuous source of fixed current is configured for generating a fixed output current within the range of from approximately one-half ampere up to approximately ten amperes.

5. An apparatus as recited in claim 1, wherein said means for continuously monitoring the voltage across said circuit under test further comprises a voltage detector circuit configured for generating an output signal in response to detecting a sufficient voltage change across said circuit under test in a sufficiently short period of time to trigger the detector.

6. An apparatus as recited in claim 5, wherein said voltage detector is configured for generating said output signal in response to conductance changes in said circuit under test which create a sufficient voltage change in the circuit under test in a sufficiently short period of time to trigger the detector.

7. An apparatus as recited in claim 6, wherein said voltage change in the circuit under test sufficient to trigger the detector is within the range from approximately 0.2 volts up to 1.0 volts.

8. An apparatus as recited in claim 7, wherein said voltage change in the circuit under test sufficient to trigger the detector is within the range from approximately 0.4 volts up to 0.7 volts.

9. An apparatus as recited in claim 1:
   wherein said means for audibly indicating a sudden change in circuit voltage comprises an audio annunciator coupled to said voltage monitoring means and configured for producing an audible output in response to said sudden change which comprises a sudden voltage rise in circuit under test; and wherein the sudden voltage rise of the wiring circuit is sensed in response to detection of a voltage rise which exceeds its former voltage value by at least a predetermined amount at a sufficient rate of voltage increase to trigger the detection.

10. An apparatus as recited in claim 1, further comprising a current selection circuit configured to allow user selection of an amount of current being output by said continuous source of output current.

11. An apparatus as recited in claim 10, wherein said current selection circuit is configured to allow selection of an output current at or less than a maximum allowable current for said circuit under test.

12. An apparatus as recited in claim 10, wherein said current selection circuit is configured for selecting one of multiple output currents.

13. An apparatus as recited in claim 1, further comprising means for discharging said charge storage capacitor in response to a second direction of voltage change in said wiring circuit.

14. An apparatus as recited in claim 1, wherein said means for audibly indicating comprises an audio annunciator circuit configured to generate a fixed duration audio output in response to detecting said conductance change.

15. An apparatus as recited in claim 14, wherein said audio annunciator circuit is configured to extend the fixed duration audio output in response to detecting repeated changes in conductance.

16. An apparatus as recited in claim 1, wherein said means for audibly indicating is configured to generate an audible annunciation in response to sudden conductance changes in the circuit under test which occur singly or repeatedly.

17. An apparatus as recited in claim 1, wherein said means for audibly indicating comprises an audible buzzer device.

* * * * *